US009376541B2

(12) United States Patent
Kang et al.

(10) Patent No.: US 9,376,541 B2
(45) Date of Patent: Jun. 28, 2016

(54) NON-CONDUCTIVE FILM AND NON-CONDUCTIVE PASTE INCLUDING ZINC PARTICLES, SEMICONDUCTOR PACKAGE INCLUDING THE SAME, AND METHOD OF MANUFACTURING THE SEMICONDUCTOR PACKAGE

(71) Applicant: Samsung Electronics Co., Ltd., Suwon-si (KR)

(72) Inventors: Un-byoung Kang, Hwaseong-si (KR); Kyung-wook Paik, Daejeon (KR); Tae-Je Cho, Daejeon (KR); Young-kun Jee, Suwno-si (KR); Sun-kyoung Seo, Suwon-si (KR); Yong-won Choi, Jeollabuk-do (KR); Ji-won Shin, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 36 days.

(21) Appl. No.: 14/288,997

(22) Filed: May 28, 2014

(65) Prior Publication Data

US 2015/0102485 A1 Apr. 16, 2015

(30) Foreign Application Priority Data

Oct. 10, 2013 (KR) ........................ 10-2013-0120864

(51) Int. Cl.
*H01L 23/29* (2006.01)
*C08K 3/08* (2006.01)
(Continued)

(52) U.S. Cl.
CPC . *C08K 3/08* (2013.01); *H01L 24/29* (2013.01); *H01L 24/32* (2013.01); *H01L 24/81* (2013.01);
(Continued)

(58) Field of Classification Search
CPC ............. H01L 2924/00014; H01L 2924/014; H01L 2224/11849; H01L 2224/119; H01L 2224/131; H01L 24/13; H01L 2224/0558; H01L 2224/05644; H01L 2224/1181; H01L 2224/1182; H01L 2224/11848; H01L 2224/13111

USPC ........... 257/738, E21.508, E23.021, E23.024, 257/E23.025, E23.067, E23.07, E23.168, 257/E23.174, 737, 772, 778, 798; 438/666
See application file for complete search history.

(56) References Cited

U.S. PATENT DOCUMENTS 5,667,884 A * 9/1997 Bolger ................. H01L 21/563
156/320
5,807,632 A * 9/1998 Pedginski ............... B32B 27/28
428/352

(Continued)

FOREIGN PATENT DOCUMENTS

JP        10233444       9/1998
JP       2000277611     10/2000

(Continued)

OTHER PUBLICATIONS

Shin, Ji-Won, et al. "Effect of NCFs with Zn-nanoparticles on the interfacial reactions of 40 um pitch Cu pillar/Sn—Ag bump for TSV interconnection." Electronic Components and Technology Conference (ECTC), 2013 IEEE 63rd. IEEE, 2013.

(Continued)

*Primary Examiner* — Stephen W Smoot
*Assistant Examiner* — Edward Chin
(74) *Attorney, Agent, or Firm* — Onello & Mello, LLP

(57) ABSTRACT

A non-conductive material layer, selected from a non-conductive film and a non-conductive polymer paste, and containing a dispersion of zinc (Zn) particles is disclosed, together with semiconductor packages including the non-conductive material layer. The non-conductive material layer contains zinc (Zn) particles having an average particle diameter of about 1 nm to about 200 nm in a non-conductive polymer base material of a film type, and a semiconductor package includes the non-conductive film. By using the non-conductive film and/or the non-conductive paste containing the zinc dispersion, e a semiconductor package having excellent electric connection properties and high reliability may be manufactured through simple processes at low manufacturing costs.

12 Claims, 12 Drawing Sheets

(51) Int. Cl.
*H01L 25/065* (2006.01)
*H01L 23/00* (2006.01)

(52) U.S. Cl.
CPC ............... *H01L 24/83* (2013.01); *H01L 24/91* (2013.01); *C08K 2003/0893* (2013.01); *C08K 2201/011* (2013.01); *H01L 24/16* (2013.01); *H01L 24/73* (2013.01); *H01L 25/0657* (2013.01); *H01L 2224/0401* (2013.01); *H01L 2224/0557* (2013.01); *H01L 2224/05647* (2013.01); *H01L 2224/05655* (2013.01); *H01L 2224/1134* (2013.01); *H01L 2224/13111* (2013.01); *H01L 2224/16145* (2013.01); *H01L 2224/16146* (2013.01); *H01L 2224/16503* (2013.01); *H01L 2224/17181* (2013.01); *H01L 2224/2732* (2013.01); *H01L 2224/27436* (2013.01); *H01L 2224/2929* (2013.01); *H01L 2224/29318* (2013.01); *H01L 2224/32505* (2013.01); *H01L 2224/33181* (2013.01); *H01L 2224/48091* (2013.01); *H01L 2224/48227* (2013.01); *H01L 2224/73104* (2013.01); *H01L 2224/73204* (2013.01); *H01L 2224/73207* (2013.01); *H01L 2224/73215* (2013.01); *H01L 2224/81191* (2013.01); *H01L 2224/81203* (2013.01); *H01L 2224/81815* (2013.01); *H01L 2224/9211* (2013.01); *H01L 2224/94* (2013.01); *H01L 2224/97* (2013.01); *H01L 2924/15311* (2013.01); *H01L 2924/3651* (2013.01)

(56) References Cited

U.S. PATENT DOCUMENTS

| | | | |
|---|---|---|---|
| 6,093,635 A | | 7/2000 | Tran et al. |
| 6,270,363 B1 * | | 8/2001 | Brofman .............. H01L 24/29 257/E21.514 |
| 7,025,607 B1 * | | 4/2006 | Das .................... H01G 4/206 439/85 |
| 8,143,722 B2 | | 3/2012 | Curtis et al. |
| 8,237,276 B2 | | 8/2012 | Song et al. |
| 8,299,633 B2 | | 10/2012 | Su |
| 9,030,724 B2 * | | 5/2015 | Agrawal ............... G02F 1/1506 359/265 |
| 2002/0079575 A1 * | | 6/2002 | Hozoji .............. H01L 23/49816 257/734 |
| 2004/0183434 A1 * | | 9/2004 | Yeh .................... H05B 33/10 313/506 |
| 2005/0219802 A1 * | | 10/2005 | Kobayashi .......... H01G 9/0032 361/523 |
| 2006/0083948 A1 * | | 4/2006 | Kawaguchi ............ H01F 10/08 428/692.1 |
| 2007/0077755 A1 | | 4/2007 | Hong |
| 2007/0155166 A1 | | 7/2007 | Kim |
| 2007/0158391 A1 | | 7/2007 | Son et al. |
| 2007/0179232 A1 * | | 8/2007 | Collins ................... C08L 15/00 524/413 |
| 2007/0211398 A1 * | | 9/2007 | Whitney .............. G06K 19/077 361/42 |
| 2007/0264478 A1 * | | 11/2007 | Liao ..................... G03G 5/0202 428/195.1 |
| 2008/0254619 A1 | | 10/2008 | Lin et al. |
| 2008/0315374 A1 * | | 12/2008 | Kim .................... H01L 23/3121 257/659 |
| 2009/0298235 A1 * | | 12/2009 | Kostiew .................. H01L 21/50 438/118 |
| 2009/0298279 A1 | | 12/2009 | Feustel et al. |
| 2010/0061734 A1 * | | 3/2010 | Knapp ................. H04B 10/807 398/128 |
| 2011/0097902 A1 | | 4/2011 | Singh et al. |
| 2013/0119424 A1 * | | 5/2013 | Kang ..................... H01L 33/60 257/98 |
| 2013/0137219 A1 * | | 5/2013 | Senzai .................... H01L 21/78 438/113 |
| 2013/0193464 A1 * | | 8/2013 | Bae ........................ H01L 33/405 257/94 |
| 2013/0292818 A1 * | | 11/2013 | Jo ........................... H01L 24/11 257/737 |

FOREIGN PATENT DOCUMENTS

| | | | |
|---|---|---|---|
| JP | 2003224163 | | 8/2003 |
| JP | 2009099669 | | 5/2009 |
| JP | 5204365 B2 * | | 6/2013 |
| KR | 2005092861 | | 9/2005 |
| KR | 2005096636 | | 10/2005 |
| KR | 100613391 | | 8/2006 |
| KR | 2006097308 | | 9/2006 |
| KR | 100708529 | | 4/2007 |
| KR | 100761596 | | 9/2007 |
| KR | 100791596 | | 9/2007 |
| KR | 2011001155 | | 1/2011 |
| KR | 101115526 | | 2/2012 |
| KR | 101147529 | | 5/2012 |
| KR | 2012054994 | | 5/2012 |
| KR | 2012134645 | | 12/2012 |

OTHER PUBLICATIONS

ECTC 2013: The 63rd Electronic Components and Technology Conference. Las Vegas, Nevada: Cosmopolitan, 2013. Print.

Ji-Won Shin, Effect of NCF's with Zn-nanoparticles on the Interfacial Reactions of 40 um Pitch Cu pillar/Sn—Ag Bump for TSV Interconnection, May 30, 2013 Electronic Components & Technology Conference, pp. 1024-1030.

* cited by examiner

NON-CONDUCTIVE FILM AND NON-CONDUCTIVE PASTE INCLUDING ZINC PARTICLES, SEMICONDUCTOR PACKAGE INCLUDING THE SAME, AND METHOD OF MANUFACTURING THE SEMICONDUCTOR PACKAGE

CROSS-REFERENCE TO RELATED APPLICATIONS

This application claims the benefit of Korean Patent Application No. 10-2013-0120864, filed on Oct. 10, 2013, in the Korean Intellectual Property Office, the disclosure of which is incorporated herein in its entirety by reference.

BACKGROUND

The inventive concept relates to a non-conductive polymer film, a non-conductive polymer paste, and a semiconductor package including the same. More particularly, the inventive concept relates to a non-conductive polymer film, to a non-conductive polymer paste with which a semiconductor package having excellent electric characteristics and high reliability is manufactured through simple manufacturing processes, and also to a semiconductor package including the non-conductive polymer film and the non-conductive polymer paste.

To deal with the demand for highly capacitive and highly integrated semiconductor devices, various connection units, such as a through silicon via, have been suggested and applied. Here, a tin (Sn) bump is generally formed on a copper (Cu) pillar and connected to a Cu pad. However, a Cu—Sn intermetallic compound may be generated that degrades connection reliability. In order to minimize the above phenomenon, various methods have been suggested; however, such methods involve complicated processes and high costs. Therefore, a new and better method of reducing the intermetallic compound from being generated using simple processes and involving low costs is necessary.

SUMMARY

The inventive concept provides a non-conductive polymer film for manufacturing a semiconductor package having an excellent connection property and high reliability through simple processes at a low cost.

The inventive concept provides a non-conductive polymer paste for manufacturing a semiconductor package having an excellent connection property and high reliability through simple processes at a low cost.

The inventive concept provides a semiconductor package having an excellent connection property and high reliability, which may be manufactured through simple processes at low manufacturing costs.

The invention concept provides a method of manufacturing a semiconductor package having an excellent connection property and high reliability through simple processes at low manufacturing costs.

According to an aspect of the inventive concept, there is provided a non-conductive film (NCF) including zinc (Zn) particles having an average particle diameter of about 1 nm to about 200 nm dispersed in a non-conductive polymer base material of a film type.

A content of the Zn particles in the NCF may be about 0.1 weight % to about 20 weight %. The non-conductive polymer base material may have a minimum viscosity of about 1 Pa·s to about 5000 Pa·s at a temperature of about 20° C.

The NCF may further include release films on opposite surfaces of the non-conductive polymer base material. The NCF may further include a flux agent.

According to an aspect of the inventive concept, there is provided a non-conductive polymer paste (NCP) including zinc (Zn) particles having an average particle diameter of about 1 nm to about 200 nm dispersed in a non-conductive polymer matrix.

A content of the Zn particles in the NCP may be about 0.1 weight % to about 20 weight %. The non-conductive polymer matrix may have a minimum viscosity of about 20 mPa·s to about 5 Pa·s at a temperature of about 20° C. The NCP may further include a flux agent.

According to an aspect of the inventive concept, there is provided a semiconductor package including: a first substrate including first electrode terminals; a second substrate including second electrode terminals facing the first electrode terminals; and a non-conductive film (NCF) containing zinc (Zn) particles having an average particle diameter of about 1 nm to about 200 nm disposed between the first substrate and the second substrate.

The Zn particles may be unevenly distributed in the NCF. In the NCF, a concentration of the Zn particles at a location that is separated by a first distance from each of the first electrode terminals may be less than a concentration of the Zn particles at a location that is separated by a second distance that is greater than the first distance from each of the first electrode terminals. In the NCF, the concentration of the Zn particles may be reduced as a distance to the first electrode terminals decreases.

The first electrode terminals and the second electrode terminals may be electrically connected to each other via solder bumps. Each of the solder bumps may include an intermetallic compound (IMC), and at least a part of the IMC may include zinc. At least a part of the IMC may include an IMC between tin (Sn) and zinc (Zn).

The NCF may be a non-conductive polymer film, or a non-conductive polymer paste that is hardened. The NCF may further include a flux agent.

The first substrate and the second substrate may be semiconductor chips that are the same as each other. The first substrate may be a printed circuit board (PCB) or an interposer, and the second substrate may be a semiconductor chip.

According to an aspect of the inventive concept, there is provided a method of manufacturing a semiconductor package, the method including: forming a non-conductive material layer containing zinc (Zn) particles on a first substrate, in which first electrode terminals are formed; stacking a second substrate including second electrode terminals on the non-conductive material layer so that the second electrode terminals face the first electrode terminals; compressing the first substrate and the second substrate; and heating the non-conductive material layer.

The Zn particles may have an average particle diameter of about 1 nm to about 200 nm. The non-conductive material layer may contain the Zn particles to a content ranging from about 0.1 weight % to about 20 weight %.

The non-conductive material layer may be a non-conductive film (NCF) or a non-conductive paste (NCP) that is hardened.

According to an aspect of the inventive concept, there is provided an electronic system including: a controller; an input/output unit for inputting or outputting data; a memory unit for storing the data; an interface unit for transmitting or receiving data to or from an external device; and a bus for connecting the controller, the input/output unit, the memory unit, and the interface unit so as to communicate with each other, wherein at least one of the controller and the memory unit may include a semiconductor package according to the inventive concept.

In an aspect a non-conductive material layer comprises a layer selected from a non-conductive film (NCF) and a non-conductive polymer paste (NCP) and further comprises a dispersion of zinc (Zn) particles having an average particle diameter of about 1 nm to about 200 nm in a non-conductive polymer base material of a film type.

In some embodiments the non-conductive material layer has a content of the Zn particles that ranges from about 0.1 weight % to about 20 weight %.

In some embodiments the non-conductive material layer has a non-conductive polymer base material that has a minimum viscosity of about 1 Pa·s to about 5000 Pa·s at a temperature of about 20° C.

In some embodiments the non-conductive material layer further comprises release films on opposite surfaces of the non-conductive polymer base material.

In some embodiments the non-conductive material layer further comprises a flux agent.

In another aspect a semiconductor package comprises: a first substrate including first electrode terminals; a second substrate including second electrode terminals facing the first electrode terminals; and a non-conductive material layer containing a dispersion of zinc (Zn) particles having an average particle diameter of about 1 nm to about 200 nm, where the non-conductive material layer is disposed between the first substrate and the second substrate.

In some embodiments the semiconductor package includes a non-conductive material layer in which the Zn particles are unevenly distributed in the non-conductive material layer.

In some embodiments the semiconductor package includes a non-conductive material layer in which a concentration of the Zn particles in the non-conductive material layer at a location that is separated by a first distance from each of the first electrode terminals is less than a concentration of the Zn particles at a location that is separated by a second distance, that is greater than the first distance, from each of the first electrode terminals.

In some embodiments the semiconductor package includes a non-conductive material layer in which the concentration of the Zn particles in the non-conductive material layer becomes lower as a distance to a first electrode terminal decreases.

In some embodiments the semiconductor package includes first electrode terminals and second electrode terminals that are electrically connected to each other via solder bumps.

In some embodiments the semiconductor package includes solder bumps that comprise an intermetallic compound (IMC), and at least a part of the IMC comprises zinc.

In some embodiments the semiconductor package includes solder bumps that comprise an intermetallic compound (IMC) where at least a part of the IMC comprises an IMC between tin (Sn) and Zn.

In some embodiments the semiconductor package includes a first substrate and a second substrate that are semiconductor chips that are the same.

In some embodiments the semiconductor package includes a first substrate that is a printed circuit board (PCB) or an interposer, and a second substrate is a semiconductor chip.

In another aspect an electronic system comprises: a controller; an input/output unit for inputting or outputting data; a memory unit for storing the data; an interface unit for transmitting or receiving data to or from an external device; and a bus for connecting the controller, the input/output unit, the memory unit, and the interface unit so as to communicate with each other, and at least one of the controller and the memory unit comprises a semiconductor package according to the present inventive concept.

In another aspect a semiconductor package comprises at least first and second semiconductor devices disposed on a substrate, where the first and second semiconductor devices are separated from each other and have corresponding facing electrical connection pads connected by first device-to-second device tin-based solder bumps, and an improvement comprises a non-conductive material layer between the first and second semiconductor devices that surrounds and contacts the first device-to-second device solder bumps, said non-conductive material layer comprising a non-conductive polymer based material containing a dispersion of zinc particles.

In some embodiments the semiconductor package includes a non-conductive material layer in which the zinc particles have an average particle diameter of about 1 nm to about 200 nm and also wherein the zinc content in the non-conductive polymer base material ranges from about 0.1% to about 20% by weight.

In some embodiments the semiconductor package includes a substrate and a first semiconductor device that are separated from each other and have corresponding facing electrical connection pads connected by substrate-to-device tin-based solder bumps, and further there is a non-conductive material layer between the substrate and the first semiconductor device that surrounds and contacts the substrate-to-device solder bumps, said non-conductive material layer comprising a non-conductive polymer base material containing a dispersion of zinc particles.

In some embodiments the semiconductor package includes at least three semiconductor devices that are stacked on a substrate and wherein tin-based solder bumps provide electrical connections between adjacent but separated semiconductor devices, and also wherein there is non-conductive material layer between adjacent semiconductor devices that surrounds and contacts the solder bumps, said non-conductive material layer comprising a non-conductive polymer base material containing a dispersion of zinc particles.

In another aspect the semiconductor package comprises: a first substrate including first electrode terminals; a second substrate including second electrode terminals facing the first electrode terminals; and, a non-conductive material layer comprising a dispersion of zinc particles having an average particle diameter of about 1 nm to about 200 nm in a non-conductive polymer base material.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The inventive concept will now be described more fully with reference to the accompanying drawings, in which exemplary embodiments of the inventive concept are shown. The inventive concept may, however, be embodied in many different forms by one of ordinary skill in the art without departing from the technical teaching of the inventive concept. In other words, particular structural and functional descriptions of the inventive concept are provided in a descriptive sense only; various changes in form and details may be made therein and thus should not be construed as being limited to the embodiments set forth herein. Because the inventive concept is not limited to the embodiments described in the present description, it should be understood that the inventive concept includes every kind of variation examples or alternative equivalents included within the spirit and scope of the inventive concept.

In the present description, terms such as 'first', 'second', etc. are used to describe various elements. However, it should be understood that the elements should not be defined by these terms. The terms are used only for distinguishing one element from another element. For example, a first element may be termed a second element, and similarly, a second element may be termed a first element, without departing from the teaching of the inventive concept.

The terminology used herein is for the purpose of describing particular embodiments only and is not intended to be limiting of exemplary embodiments. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

Figure 1:
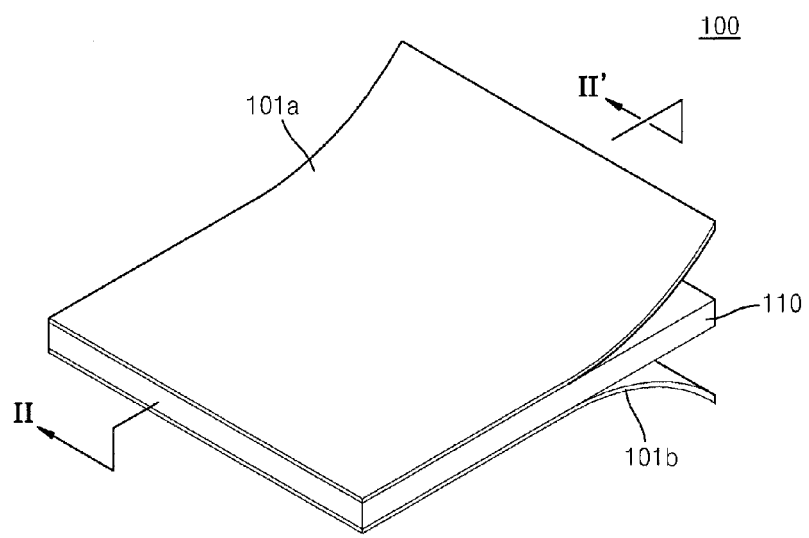
FIG. 1 is a schematic perspective view of a non-conductive polymer film according to an embodiment of the present inventive concept.
Figure 2:
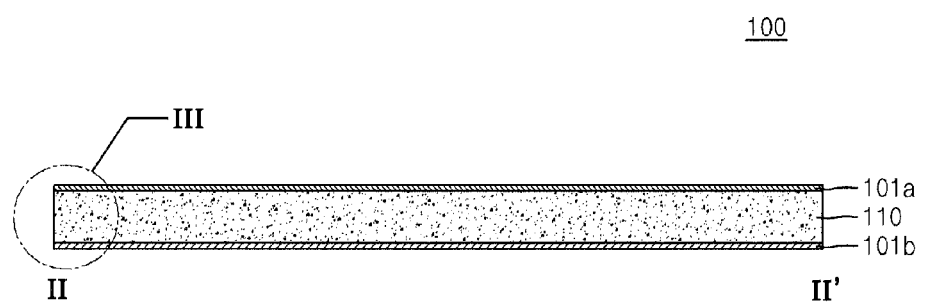
FIG. 2 is a cross-sectional view of the non-conductive polymer film taken along a line II-II' of FIG. 1.

The present inventive concept provides a non-conductive film (NCF). FIG. 1 is a perspective view of an NCF 100 according to an embodiment of the present invention. FIG. 2 is a cross-sectional view of the NCF 100 taken along the plane II-II' of FIG. 1, and FIG. 3 is a partially enlarged view of a portion denoted as III in FIG. 2.

Figure 3:
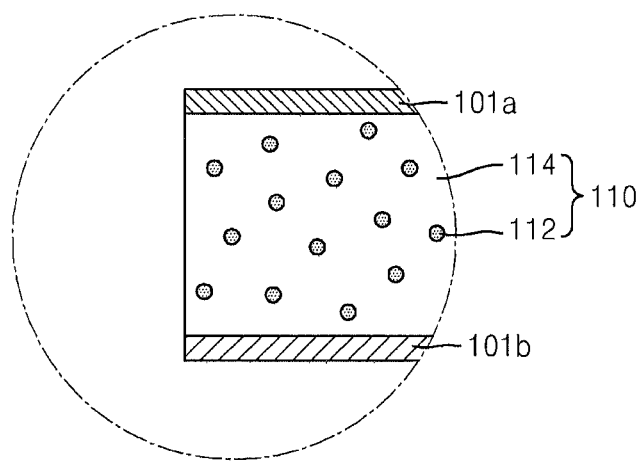
FIG. 3 is a partially enlarged view of a portion denoted as III in FIG. 2.

Referring to FIGS. 1 through 3, the NCF 100 may include a non-conductive polymer base material 110.

The non-conductive polymer base material 110 may include a non-conductive polymer resin layer 114 (FIG. 3) and zinc (Zn) particles 112 that are evenly distributed in the non-conductive polymer resin layer 114.

The non-conductive polymer resin layer 114 may be a well-known insulating polymer resin, for example, a film formed of an epoxy-based thermosetting resin composition or an acrylic-based thermosetting resin composition. Such resin compositions may be thermosetting resins.

The epoxy-based thermosetting resin composition may include a compound or resin having two or more epoxy groups in a molecule, an epoxy hardener, and a film-forming component.

The compound or resin having two or more epoxy groups in the molecule may be in a liquid phase or a solid phase. For example, the compound or resin having two or more epoxy groups in the molecule may be a di-functional epoxy resin such as a bisphenol A epoxy resin and a bisphenol F epoxy resin, or a novolac epoxy resin such as a phenol novolac epoxy resin and a cresol novolac epoxy resin. Also, a cycloaliphatic epoxy resin compound such as 3,4-epoxycyclohexylmethyl-3',4'-epoxycyclohexenecarboxylate may be used.

An epoxy hardener may be, for example, an amine-based hardener, an imidazole-based hardener, an anhydride-based hardener, a sulfonium cation-based hardener, or the like.

A film forming component may be, for example, a phenoxy resin or an acrylic resin that is compatible with the epoxy compound or the epoxy resin.

The acrylic-based thermosetting resin composition may include, for example, a (meth)acrylate monomer, a film-forming resin, an inorganic filler such as silica, a silane coupling agent, and a radical polymerization initiator.

The (meth)acrylate monomer may be, for example, a single-functional (meth)acrylate monomer, a multi-functional (meth)acrylate monomer, or a modified single-functional or multi-functional (meth)acrylate monomer that is obtained by introducing an epoxy group, a urethane group, an amino group, an ethylene oxide group, or a propylene oxide group into the single or multi-functional (meth)acrylate monomer. Otherwise, another monomer that may be radically copolymerized with the (meth)acrylate monomer, for example, (meth)acrylic acid, acetic acid vinyl, styrene, vinyl chloride, etc. may be used.

The film-forming resin of the acrylic-based thermosetting resin composition may be, for example, a phenoxy resin, a polyvinyl acetal resin, a polyvinyl butyral resin, an alkylated cellulose resin, a polyester resin, an acryl resin, a styrene resin, a urethane resin, a polyethylene terephthalate resin, etc.

Also, the radical polymerization initiator may be organic peroxide such as benzoyl peroxide, dicumyl peroxide, dibutyl peroxide, and the like, or an azobis-based compound such as azobisisobutyronitrile, azobisvaleronitrile, and the like.

The acrylic-based thermosetting resin composition may further include one or more of a stress reliever such as butadiene rubber, a solvent such as ethyl acetate, a stain, an antioxidant, and an anti-aging agent, if necessary or desirable.

A method of manufacturing the non-conductive polymer resin layer 114 by using the epoxy-based thermosetting resin composition or the acryl-based thermosetting resin composition is well known in the art, and thus, detailed descriptions thereof are not provided here.

The NCF 100 may have a thickness of about 15 μm to about 100 μm, for example, about 20 μm to about 70 μm, or in particular, about 25 μm to about 50 μm.

If the thickness of the NCF 100 is too thin, a handling property of the NCF 100 is degraded and a desired function of the NCF 100, namely filling gaps between semiconductor chips, may not be sufficiently achieved. On the contrary, if the NCF 100 is excessively thick, the NCF 100 may overflow when it is heated and compressed. Thus, one of ordinary skill in the art would select an appropriate thickness of the NCF 100 in consideration of the above characteristics and desired functionalities.

As described above, the non-conductive polymer base material 110 may also include Zn particles 112.

The Zn particles 112 may be pure Zn particles, and may have an average particle diameter of about 1 nm to about 200 nm. In particular, the average particle diameter of the Zn particles 112 may be about 1 nm to about 50 nm, for example, about 3 nm to about 20 nm.

The average particle diameter of the Zn particles 112 may be measured by using a quasi-elastic light scattering (QELS) method such as a dynamic light scattering (DLS) method and a photon correlation spectroscopy (PCS) method. The average particle diameter of the Zn particles 112 may vary somewhat depending on the measuring method used. Here, the average particle diameter of the Zn particles 112 is measured by using the DLS method.

If the average particle diameter of the Zn particles 112 is too small, an amount of a dispersing agent that is necessary for maintaining the dispersed state of the particles may be too high, and thus, it may be difficult to obtain a high-quality NCF 100. However, if the average particle diameter of the Zn particles 112 is too large, the stability of the dispersion of Zn particles 112 in the polymer base material 110 may be degraded, and thus, sedimentation of the particles increases. Thus, one of ordinary skill in the art may appropriately adjust the average particle diameter of the Zn particles 112.

Also, in the non-conductive polymer base material 110, a content of the Zn particles 112 may be about 0.1 weight % to about 20 weight %. For example, the content of the Zn particles 112 may be about 0.5 weight % to about 5 weight %, in particular, may be about 1 weight % to about 3 weight %.

If the content of the Zn particles 112 in the non-conductive polymer base material 110 is too low, desirable effects that may be obtained by adding the Zn particles 112 may not be obtained. On the contrary, if the content of the Zn particles 112 in the non-conductive polymer base material 110 is too high, diffusion of Zn may be restricted due to coagulation of the Zn particles 112.

The non-conductive polymer base material 110 may have a minimum viscosity of about 1 Pa·s to about 5000 Pa·s at a temperature of 20° C. In particular, the non-conductive polymer base material 110 may have a viscosity of about 10 Pa·s to about 1000 Pa·s, for example, of about 50 Pa·s to about 600 Pa·s.

If the viscosity of the non-conductive polymer base material 110 is too low, stability against heating and compressing may be insufficient. On the other hand, if the viscosity of the non-conductive polymer base material 110 is too high, the mobility of the Zn particles 112 is degraded, and thus, it may interfere with the diffusion of the non-conductive polymer base material 110 into a solder bump, as described hereinafter.

Release films 101a and 101b may be provided on opposite surfaces of the non-conductive polymer base material 110. The release films 101a and 101b may protect the non-conductive polymer base material 110, and may be attached to the opposite surfaces of the non-conductive polymer base material 110 with an appropriate adhesive force. The adhesive force may be, for example, about 1 kgf/in to about 50 kgf/in.

Also, the NCF 100 may further include a flux agent in the non-conductive polymer resin layer 114. The flux agent may be a thermal acid generator (TAG) that is dissolved by anhydride generating Lewis acid or by an annealing operation that generates acid. In particular, the anhydride may be selected to include an acyl group. In addition, the TAG may be a sulfite-based compound.

However, the flux agent is not limited thereto, and may be an inorganic flux such as a zinc chloride-based or a zinc chloride-ammonium chloride-based flux; a rosin-based flux such as an active rosin or an inactive rosin; an aqueous flux such as salts, acids, or amines; and an organic flux such as glutamic acid hydrochloride or ethylenediamine stearic acid hydrochloride.

In the NCF 100, a content of the flux agent may be, for example, about 0.05 weight % to about 5 weight %, in particular, about 0.1 weight % to about 2 weight %.

After removing the release film 101a on a surface of the NCF 100, the NCF 100 may be attached to a predetermined substrate, and then the release film 101b on the opposite surface is removed, and another substrate may be attached to the opposite surface of the NCF 100.

According to one or more embodiments of the present inventive concept, a non-conductive polymer paste (NCP) is provided.

The NCP may include a non-conductive polymer matrix containing Zn particles. Here, a content of the Zn particles may be about 0.1 weight % to about 20 weight % based on a weight of the NCP. More particularly, the content of the Zn particles may be about 0.5 weight % to about 5 weight %, for example, about 1 weight % to about 3 weight %.

The non-conductive polymer matrix for the NCP may include materials that are the same as those of the non-conductive polymer resin layer 114 described with reference to FIGS. 1 through 3; however, the present inventive concept is not limited thereto.

The Zn particles may have an average particle diameter of about 1 nm to about 200 nm, for example, of about 1 nm to about 50 nm, and in particular, of about 3 nm to about 20 nm.

Also, the NCP may further include a flux agent. The flux agent is described above with reference to FIGS. 1 through 3, and thus, detailed descriptions thereof are not provided here.

A content of the flux agent in the NCP is about 0.05 weight % to about 5 weight %, and in particular, about 0.1 weight % to about 2 weight %.

Also, the NCP may have a minimum viscosity of about 20 mPa·s to about 5 Pa·s at a temperature of 20° C. In particular, the NCP may have a minimum viscosity of about 30 mPa·s to about 2 Pa·s, for example, about 50 mPa·s to about 600 mPa·s.

The NCP may further include a solvent. The solvent may be an aqueous solvent or a non-aqueous solvent. The aqueous solvent may be, for example, water and an alcohol with a carbon number of 1 to 7. The non-aqueous solvent may be N-methylpyrrolidone, N-ethylpyrrolidone, dipropylene glycol, dimethyl ether, ethyl acetate, butyl acetate, ethylene glycol monomethyl or monoethyl ether acetate, 1-Methoxypropyl-2-acetate, 3-methoxy-n-butyl acetate, acetone, 2-butanone, 4-methyl-2-pentanone, cyclohexanone, dimethyl carbonate, diethyl carbonate, 1,2-ethylene carbonate, 1,2-propylene carbonate, β-propiolactone, γ-butyrolactone, ε-caprolactone, ε-methyl caprolactone, propylene glycol diacetate, diethylene-glycol-dimethyl-ether, diethylene-glycol-ethyl-ether acetate, diethylene-glycol-butyl-ether-acetate, N-methyl caprolactam, N,N-dimethylaminopropylamine, ethylene oxide, tetrahydrofuran, dimethylformamide, dimethylacetamid, or a compound thereof.

A content of the solvent in the NCP may bring the viscosity of the NCP above the minimum viscosity as previously discussed.

Figure 4:
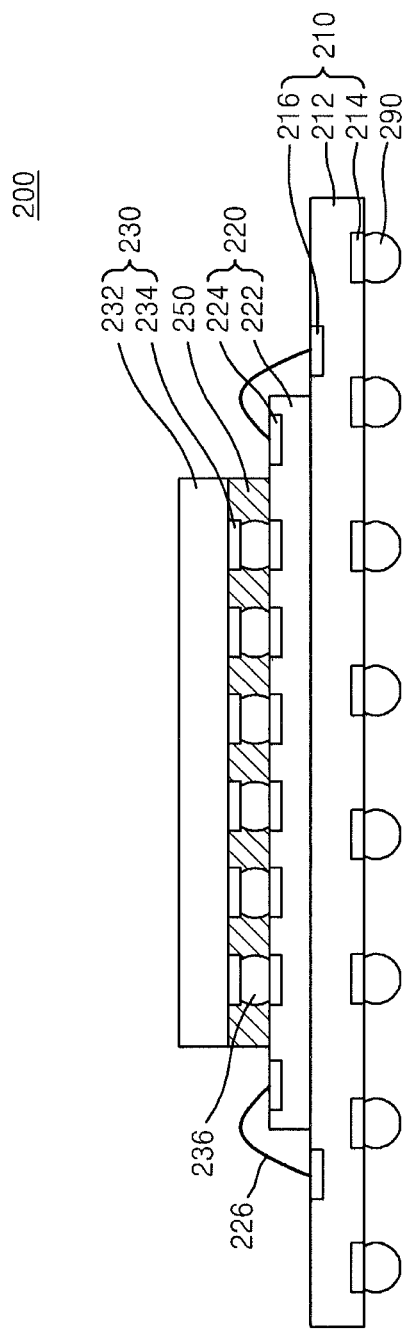
FIGS. 4 through 6 are schematic cross-sectional views of semiconductor packages according to embodiments of the present inventive concept.

The present inventive concept provides a semiconductor package including a non-conductive material layer. FIG. 4 is a side-sectional view of a semiconductor package 200 according to an embodiment of the present inventive concept.

Referring to FIG. 4, a first semiconductor chip 220 may be disposed on a substrate 210. Here, an active surface of the first semiconductor chip 220 may face upward (i.e., away from the substrate 210).

The substrate 210 may be a printed circuit board (PCB) or a flexible PCB (FPCB). A base material 212 of the substrate 210 may have a stacked structure in which various material layers are stacked. The structure of based material 212 defines two main surfaces. The various material layers may include one or more metal wiring layers and one or more prepreg (PPG) layers. A metal forming the metal wiring layers may be, for example, copper (Cu), gold (Au), platinum (Pt), silver (Ag), nickel (Ni), aluminum (Al), invar, or the like; however, the present inventive concept is not limited thereto.

A solder resist (SR) layer may be formed on an outermost part of the base material 212. The SR layer may be formed on only one of two main surfaces of the base material 212, or on both of the main surfaces of the base material 212.

The SR layer may be formed of an acrylic-based resin, an epoxy-based resin, a urethane-based resin, a silicon-based resin, a paraxylene-based resin, or a parylene-based resin, which is formed using a dipping method, a spraying method, a flow coating method, a vacuum coating method, or the like. In addition, the SR layer mechanically protects the substrate 210, prevents corrosion, and improves electrical characteristics.

A connection pad 216 for electrically connecting to a semiconductor chip mounted on an upper surface of the substrate 210 may be disposed on the upper surface of the substrate 210.

The connection pad 216 may be a conductive pad, for example, a metal pad. In particular, the connection pad 216 may be, for example, a Cu pad, a Ni pad, or an Al pad plated with Ni. However, the present inventive concept is not limited thereto.

Also, a connection pad 214 for electrically connecting to an external device may be disposed on a lower surface of the substrate 210. The connection pad 214 disposed on the lower surface of the substrate 210 may be a conductive pad, like the connection pad 216 disposed on the upper surface of the substrate 210, for example, a metal pad. In particular, the connection pad 214 may be, for example, a Cu pad, a Ni pad, or an Al pad plated with Ni. However, the present inventive concept is not limited thereto.

A solder bump 290 for connecting to an external device may be disposed on the connection pad 214. The solder bump 290 may be a tin (Sn)-based solder bump. In more detail, the solder bump 290 may include Sn as a main component, and also may include Ag and/or Cu. However, the present inventive concept is not limited thereto.

The first semiconductor chip 220 may include a semiconductor substrate 222 and connection pads 224 disposed on an active surface of the semiconductor substrate 222.

According to an embodiment of the present inventive concept, the semiconductor substrate 222 may be a silicon (Si) substrate. According to another embodiment of the present inventive concept, the semiconductor substrate 222 may include a semiconductor element such as germanium (Ge), or a compound semiconductor such as silicon carbide (SiC), gallium arsenide (GaAs), indium arsenide (InAs), and indium phosphide (InP). According to at least one embodiment of the present inventive concept, the semiconductor substrate 222 may have a silicon-on-insulator (SOI) structure, for example, the semiconductor substrate 222 may include a buried oxide (BOX) layer. In embodiments of the present inventive concept, the semiconductor substrate 222 may include a conductive region, for example, a well doped with impurities or a structure doped with impurities. Also, the semiconductor substrate 222 may have various device isolation structures such as a shallow trench isolation (STI) structure.

Various semiconductor devices may be provided on the active surface of the semiconductor substrate 222. Such semiconductor devices may include a memory device, a core circuit device, a peripheral circuit device, a logic circuit device, or a control circuit device. Examples of the memory device may include, for example, volatile memory devices such as dynamic random access memories (DRAMs) or static random access memories (SRAMs), and non-volatile memory devices such as erasable programmable read only memories (EPROMs), electrically EPROM (EEPROM), and flash EEPROM. In other embodiments, an image sensor such as a system large-scale integration (LSI) or a CMOS imaging sensor (CIS), a micro-electro-mechanical system (MEMS), an active device, or a passive device may be provided on the active surface of the semiconductor substrate 222.

Also, a wiring layer may be disposed on the semiconductor devices on the active surface of the semiconductor substrate 222. The wiring layer may include a wiring pattern and an insulating layer. Also, the wiring pattern may be electrically connected to the connection pads 224 that are electrode terminals. Some of the connection pads 224 may be electrically connected to the connection pads 216 of the substrate 210 via bonding wires 226, as shown in FIG. 4.

A second semiconductor chip 230 may be provided on the first semiconductor chip 220. The second semiconductor chip 230 may be mounted as a flip chip so that connection pads 234 that are electrode terminals of the second semiconductor chip 230 may face and align with connection pads 224 that are the electrode terminals of the first semiconductor chip 220.

A semiconductor substrate 232 of the second semiconductor chip 230 may be a Si substrate, or the semiconductor substrate 232 may include a semiconductor element such as germanium (Ge), or a compound semiconductor such as silicon carbide (SiC), gallium arsenide (GaAs), indium arsenide (InAs), and indium phosphide (InP), as also described above for the semiconductor substrate 222, and thus, detailed descriptions thereof are not provided here.

Various semiconductor devices may be provided on an active surface of the semiconductor substrate 232. The semiconductor devices may include a memory device, a core circuit device, a peripheral circuit device, a logic circuit device, or a control circuit device, as also described above for the semiconductor substrate 222, and thus, detailed descriptions thereof are not provided here.

The connection pads 234 of the second semiconductor chip 230 may be electrically connected to the corresponding connection pads 224 of the first semiconductor chip 220 via solder bumps 236. The solder bumps 236 may be tin (Sn)-based solder bumps. In particular, each of the solder bumps 236 may include Sn as a main component, and also may include Ag and/or Cu. However, the present inventive concept is not limited thereto.

A non-conductive material layer 250 may be disposed between the first and second semiconductor chips 220 and 230. The non-conductive material layer 250 may be an NCF that is described above, or a hardened NCF. Therefore, a repeated description thereof is omitted.

The non-conductive material layer 250 may include Zn particles. The Zn particles may have an average particle diameter of about 1 nm to about 200 nm, in more detail, of about 1 nm to about 50 nm, for example, of about 3 nm to about 20 nm.

Also, a content of the Zn particles in the non-conductive material layer 250 may range from about 0.1 weight % to about 20 weight %. More particularly, the content of the Zn particles in the non-conductive layer may be about 0.5 weight % to about 5 weight %, for example, about 1 weight % to about 3 weight %.

Figure 5:
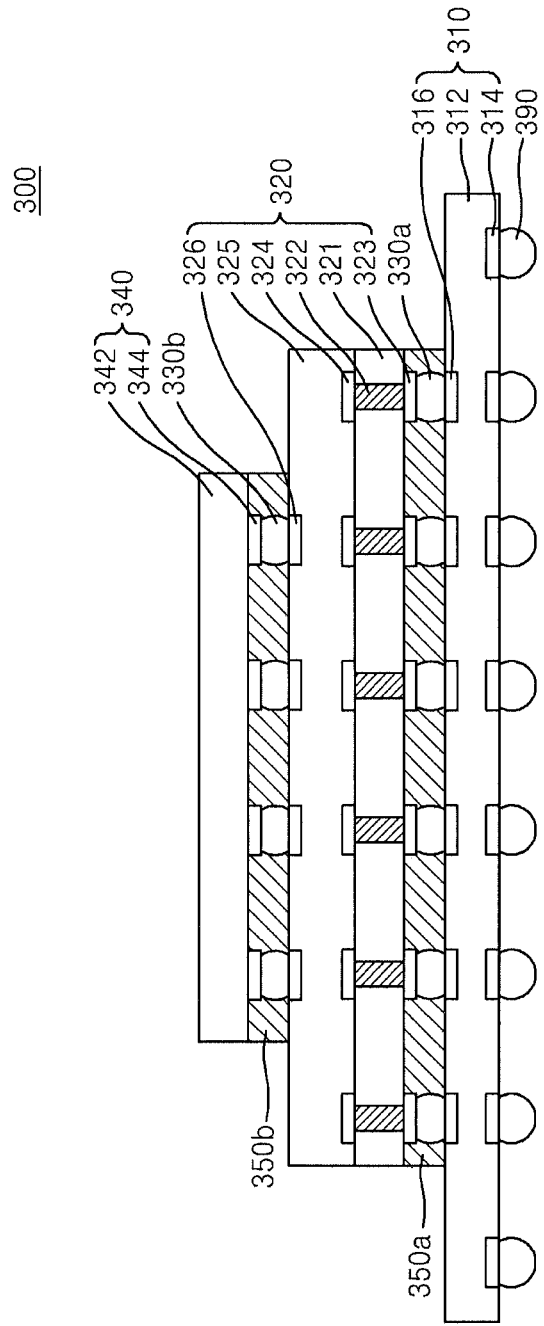

FIG. 5 is a side-sectional view of a semiconductor package 300 according to another embodiment of the present inventive concept.

Referring to FIG. 5, a first semiconductor chip 320 and a second semiconductor chip 340 are sequentially stacked on a substrate 310. Here, the first semiconductor chip 320 may have a through silicon via (TSV) electrode, and the second semiconductor chip 340 may be flip chip mounted.

The substrate 310 may be a PCB or a flexible PCB. Connection pads 316 for electrically connecting to the first semiconductor chip 320 may be disposed on an upper surface of the substrate 310.

The connection pads 316 may be conductive pads, for example, metal pads. In particular, the connection pads 316 may be Cu pads, Ni pads, or Al pads plated with Ni. However, the present inventive concept is not limited thereto.

Also, connection pads 314 for electrically connecting to external devices may be provided on a lower surface of the substrate 310. Like the connection pads 316, the connection pads 314 disposed on the substrate 310 are conductive pads, and thus, detailed descriptions thereof are not provided here.

A solder bump 390 for connecting to an external device may be disposed on each of the connection pads 314. The solder bump 390 may be a tin (Sn)-based solder bump. In more detail, the solder bump 390 may include Sn as a main component, and also may include Ag and/or Cu. However, the present inventive concept is not limited thereto.

The first semiconductor chip 320 includes a semiconductor layer 321, penetration electrodes 322, and a wiring layer 325. Formed in the wiring layer 325 may be via pads 324 connecting to the penetration electrodes 322, connection pads 326 for electrically connecting to the second semiconductor chip 340, and internal wires for electrically connecting the via pads 324 to the connection pads 326.

The semiconductor layer 321 is as described above with reference to the semiconductor substrate 222 shown in FIG. 4, and thus, detailed descriptions thereof are not provided here.

Each of the penetration electrodes 322 may have a structure in which an insulating layer, a seed layer, and a conductive layer are sequentially stacked. The insulating layer may electrically insulate the conductive layer from the semiconductor layer 321. The insulating layer may include oxides, nitrides, or oxynitrides, for example, silicon oxides, silicon nitrides, or silicon oxynitrides. The conductive layer may include a conductive material, for example, a metal. The conductive layer may include, for example, one or more metals selected from aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). The insulating layer, the seed layer, and the conductive layer forming the penetration electrode 322 may be formed by using a chemical vapor deposition (CVD) method, a plasma-enhanced CVD (PE-CVD) method, a high density plasma CVD (HDP-CVD) method, a sputtering method, a metal organic CVD (MOCVD) method, or an atomic layer deposition (ALD) method.

As shown in FIG. 5, via pads 323 and 324 are respectively disposed on upper and lower portions of the penetration electrodes 322, and may be formed integrally with or separately from the penetration electrodes 322. Also, the via pads 323 and 324 may be formed of a material that is the same as that of the penetration electrodes 322, or different from that of the penetration electrodes 322.

The substrate 310 and the first semiconductor chip 320 may be electrically connected to each other via solder bumps 330a. The solder bumps are as described above with reference to the corresponding components of FIG. 4, and thus, detailed descriptions thereof are not provided here.

As shown in FIG. 5, the second semiconductor chip 340 may be mounted on the first semiconductor chip 320 as a flip chip. The flip-chip mounting of the second semiconductor chip 340 is described above with reference to the corresponding components of FIG. 4, and thus, detailed descriptions thereof are omitted here.

The second semiconductor chip 340 provided on the first semiconductor chip 320 may include a semiconductor substrate 342 and connection pads 344 provided on an active surface of the semiconductor substrate 342. The semiconductor substrate 342 may be formed of various materials that are described above with reference to the semiconductor substrate 222 shown in FIG. 4. Also, various semiconductor devices described with reference to the semiconductor substrate 222 of FIG. 4 may similarly be provided on the active surface of the semiconductor substrate 342.

The connection pads 326 and 344 may be respectively provided on an upper surface of the first semiconductor chip 320 and on a lower surface of the second semiconductor chip 340 to correspond to each other. Also, a corresponding pair of the connection pads 326 and 344 may be electrically connected to each other via a solder bump 330b. The solder bumps are as described above with reference to the corresponding components of FIG. 4, and thus, detailed descriptions thereof are not provided here.

The wiring layer 325 may include a single-layered or a multi-layered insulating material, and may include wires for electrically connecting the via pads 324 to the connection pads 344 therein. The insulating material may be, for example, silicon oxide, silicon nitride, and/or silicon oxynitride; however, the embodiments of the present inventive concept are not limited thereto.

Non-conductive material layers 350a and 350b may be provided respectively between the substrate 310 and the first semiconductor chip 320 and/or between the first semiconductor chip 320 and the second semiconductor chip 340. The non-conductive material layers 350a and 350b may be NCFs that are described above, or may be hardened NCPs that are described above. Therefore, detailed descriptions of the non-conductive material layers 350a and 350b are not provided here.

Figure 6:
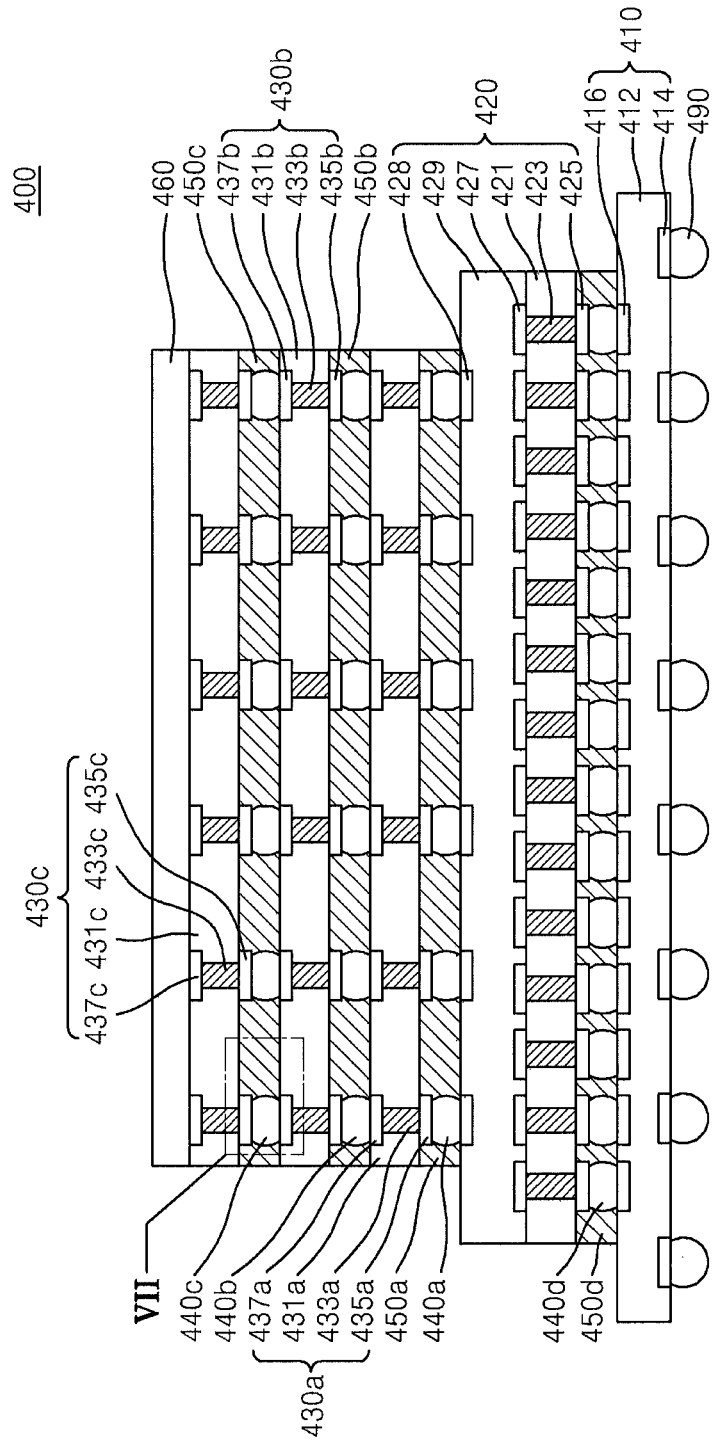

FIG. 6 is a side-sectional view of a semiconductor package 400 according to another embodiment of the present inventive concept.

Referring to FIG. 6, an interposer 420 is provided on a substrate 410, and a plurality of semiconductor chips 430a, 430b, and 430c are stacked on the interposer 420. The plurality of semiconductor chips 430a, 430b, and 430c may be semiconductor chips respectively including penetration electrodes 433a, 433b, and 433c.

The substrate 410 may be a PCB or a flexible PCB. Connection pads 416 for electrically connecting to the interposer 420 may be provided on an upper surface of the substrate 410 (i.e., on a surface facing interposer 420).

Each of the connection pads 416 may be a conductive pad, for example, a metal pad. In more detail, the connection pad 416 may be a Cu pad, a Ni pad, or an Al pad plated with Ni; however, the embodiments of the present inventive concept are not limited thereto.

Also, connection pads 414 for electrically connecting to an external device may be disposed on a lower surface of the substrate 410. Like the connection pads 416 formed on the upper surface of the substrate 410, the connection pads 414 provided on the lower surface of the substrate 410 are conductive pads, and thus, detailed descriptions thereof are omitted here.

A solder bump 490 for connecting to an external device may be disposed on each of the connection pads 414. The solder bump 490 may be a Sn-based solder bump. In more detail, the solder bump 490 may include Sn as a main component, and may also include Ag and/or Cu. However, the present inventive concept is not limited thereto.

The interposer 420 may be provided on the substrate 410. The interposer 420 may include a base portion 421, penetration electrodes 423 penetrating through the base portion 421, and a wiring layer 429 disposed along a side of the base portion 421.

The base portion 421 may be formed of a semiconductor material or an insulating material, for example, silicon, germanium, silicon-germanium, gallium-arsenic, glass, or ceramic. The base portion 421 may include an undoped material.

The penetration electrodes 423 penetrating through the base portion 421 may be formed in the base portion 421. Each of the penetration electrodes 423 may include a structure in which an insulating layer, a seed layer, and a conductive layer are sequentially formed as described above with respect to penetration electrodes 322 in FIG. 5, and thus, detailed descriptions thereof are not provided here. Also, via pads 425 and 427 may be provided on upper and lower portions of each of the penetration electrodes 423. The via pads 425 and 427 may be formed integrally with or separately from the penetration electrode 423. Also, the via pads 425 and 427 may be formed of the same material as that of the penetration electrode 423, or a different material from that of the penetration electrode 423.

The substrate 410 and the interposer 420 may be electrically connected to each other via solder bumps 440d. The solder bumps are described above with reference to the corresponding components of FIG. 4, and thus, detailed descriptions of the solder bumps 440d are not provided here.

The plurality of semiconductor chips 430a, 430b, and 430c may be stacked on the interposer 420. The plurality of semiconductor chips 430a, 430b, and 430c may respectively include semiconductor layers 431a, 431b, and 431c and the penetration electrodes 433a, 433b, and 433c. Here, three semiconductor chips are stacked; however, embodiments of the present inventive concept are not limited thereto, and more or fewer semiconductor chips may be stacked on interposer 420. The semiconductor chips 430a, 430b, and 430c may include a first semiconductor chip 430a, a second semiconductor chip 430b, and a third semiconductor chip 430c respectively spaced at increasing distances from the bottom of interposer 420. The first, second, and third semiconductor chips 430a, 430b, and 430c may be of the same or different semiconductor chip structure/configuration.

The semiconductor layer 431a, 431b, or 431c is as described above with reference to the substrate 222 shown in FIG. 4, and thus, detailed descriptions thereof are not provided here.

The penetration electrodes 433a, 433b, and 433c are respectively formed in the semiconductor layers 431a, 431b, and 431c. Each of the penetration electrodes 433a, 433b, and 433c may include a structure in which an insulating layer, a seed layer, and a conductive layer are sequentially formed as described with reference to penetration electrodes 322 in FIG. 5, and thus, detailed descriptions thereof are not provided here.

Via pad pairs 435a, 437a, 435b, 437b, and 435c, 437c may be disposed respectively on upper and lower portions of the penetration electrodes 433a, 433b, and 433c. In FIG. 6, the via pads 437a, 437b, and 437c respectively on upper portions of the penetration electrodes 433a, 433b, and 433c are buried in the semiconductor layers 431a, 431b, and 431c, and the via pads 435a, 435b, and 435c respectively on lower portions of the penetration electrodes 433a, 433b, and 433c may protrude out of the semiconductor layers 431a, 431b, and 431c. Thus, via pads may be buried in the semiconductor layers 431a, 431b, and 431c, or protrude out of the semiconductor layers 431a, 431b, and 431c.

Each of the via pads 435a, 437a, 435b, 437b, 435c, and 437c may be a conductive pad, for example, a metal pad. In more detail, each of the via pads 435a, 437a, 435b, 437b, 435c, and 437c may be, for example, a Cu pad, a Ni pad, or an Al pad plated with Ni. However, embodiments of the present inventive concept are not limited thereto.

The via pads 435a, 437a, 435b, 437b, 435c, and 437c may be formed integrally with or separately from corresponding penetration electrodes 433a, 433b, and 433c. Also, the via pads 435a, 437a, 435b, 437b, 435c, and 437c may be formed of the same material as or a different material from that of the respective penetration electrodes 433a, 433b, and 433c.

The interposer 420 and the first semiconductor chip 430a may be electrically connected to each other via the solder bumps 440d. The first semiconductor chip 430a and the second semiconductor chip 430b may be electrically connected to each other via solder bumps 440b. The second semiconductor chip 430b and the third semiconductor chip 430c may be electrically connected to each other via solder bumps 440c. The solder bumps are as described above with reference to the corresponding components of FIG. 4, and thus, detailed descriptions thereof are not provided here.

Non-conductive material layers 450a, 450b, 450c, and 450d may be provided respectively between the interposer 420 and the first semiconductor chip 430a, between the first semiconductor chip 430a and the second semiconductor chip 430b, between the second semiconductor chip 430b and the third semiconductor chip 430c, and/or between the substrate 410 and the interposer 420. The non-conductive material layers 450a, 450b, 450c, and 450d may be NCFs as described above, or hardened NCPs. Therefore, detailed descriptions of the non-conductive material layers 450a, 450b, 450c, and 450d are omitted here.

An uppermost layer 460 may be provided on the third semiconductor chip 430c that is the uppermost semiconductor chip in which penetration electrodes are formed. The uppermost layer 460 may be another semiconductor chip that is mounted as a flip chip or a protective layer such as silicon oxide or silicon nitride for protecting the third semiconductor chip 430c.

Figure 7:
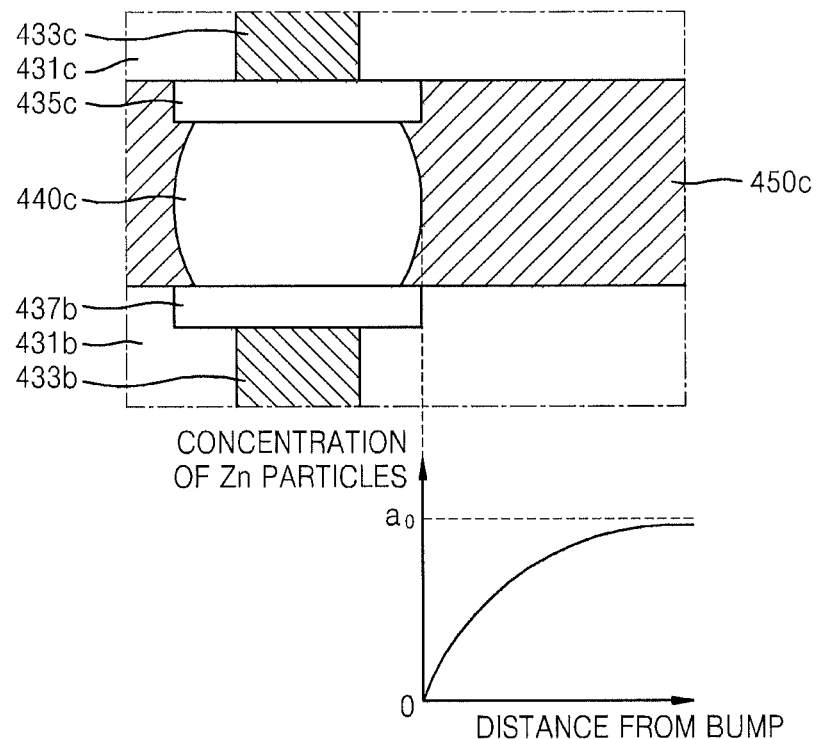
FIG. 7 is a schematic diagram of an enlarged view of portion VII of FIG. 6.

FIG. 7 is a schematic diagram of an enlarged view of portion VII of FIG. 6.

Referring to FIG. 7, the non-conductive material layer 450c surrounds the solder bump 440c. As described above, the non-conductive material layer 450c is an NCF or a hardened NCP, as previously described, and thus, Zn particles are distributed in the non-conductive material layer 450c.

A graph shown in FIG. 7 shows a distribution of the Zn particles in the non-conductive material layer 450c according to locations thereof. As shown in the graph, a concentration of the Zn particles is not constant according to the locations in the non-conductive material layer 450c. In particular, the concentration of the Zn particles may vary depending on a distance from the solder bump 440c. In addition, the concentration of the Zn particles may be 0 or close to 0 around a surface of the solder bump 440c. That is, the concentration of the Zn particles may increase as the distance from the surface of the solder bump 440c increases, and in particular, may increase while asymptotically approaching a concentration $a_0$ of Zn particles in a bulk status.

The variation in the concentration of the Zn particles may be established by the dispersion of the Zn particles when manufacturing the semiconductor packages 200, 300, or 400 as shown respectively in FIGS. 4, 5 and 6. In this case, as shown in FIG. 7, a gradient of the variation in the concentration of the Zn particles (i.e., the slope of the gradient curve) may gradually increase while approaching the surface of the solder bump 440c.

FIG. 7 shows that the concentration of the Zn particles asymptotically approaches the concentration $a_0$ of the bulk state when the distance from the solder bump 440c increases, under an assumption where another solder bump 440c does not exist in a corresponding direction. Alternatively, if a distance between two adjacent solder bumps in the non-conductive material layer 450c is short, the concentration of the Zn particles may first increase moving away from a first solder bump, and then decrease as the neighboring solder bump is approached.

As the Zn particles from adjacent regions of the non-conductive material layer 450c become dispersed into the solder bump 440c, growth of an intermetallic compound (IMC) may be restrained in the solder bump 440c. In more detail, in a case where a Sn-based solder bump and a Cu pad are bonded to each other, growth of an IMC, such as $Cu_3Sn$ and $Cu_6Sn_5$, may be restrained by the presence of Zn particles. That is, the Zn that becomes dispersed into the solder bump participates in a reaction to form an IMC that includes Zn, and in this way, generation of a copper-tin IMC, such as $Cu_3Sn$ and $Cu_6Sn_5$, may be reduced. As a result, formation of a Kirkendall void may be prevented, and thus, excellent electric connection properties and high reliability may be obtained in the semiconductor device.

Hereinafter, configurations and effects of the present inventive concept will be described in detail with experimental examples and comparative examples; however, the experimental examples should not be understood to limit the scope of the present inventive concept.

In experimental examples, Zn particles were added to an NCF having a minimum viscosity of about 500 Pa·s and containing a flux agent to obtain Zn contents of 1 weight %, 5 weight %, and 10 weight %. Then, the NCF was applied to the solder bump and aged at a temperature of about 150° C. Next, a formation height of a copper-tin IMC, that is, $Cu_3Sn$, is quantified as a formation degree of the IMC.

Also, an NCF, in which Zn particles are not added, is used as a comparative example so that the formation degree of the copper-tin IMC, that is, $Cu_3Sn$, is quantified in the same way as above.

Figure 8:
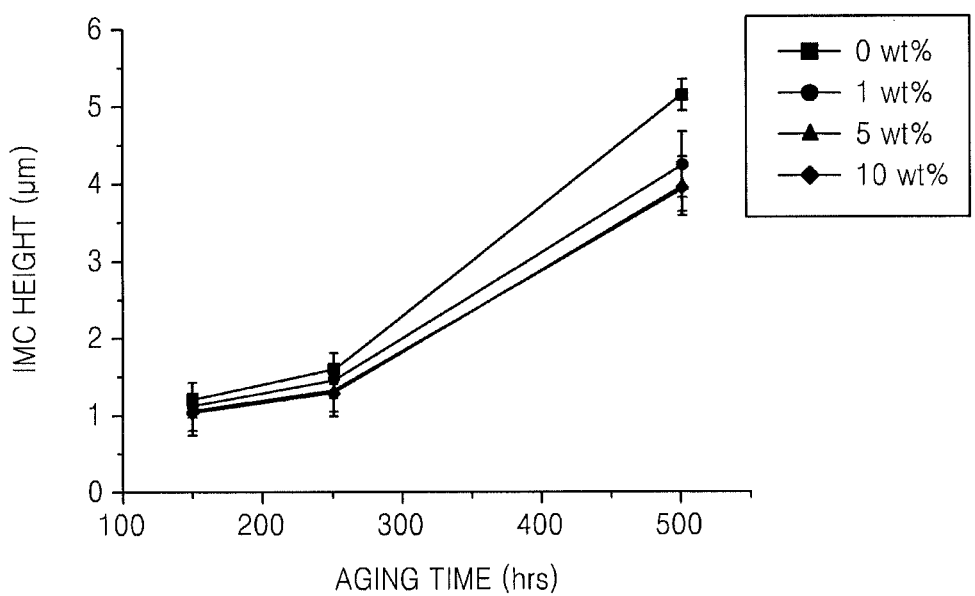
FIG. 8 is a graph showing variations in intermetallic compounds generated according to an experimental embodiment and a comparative example.

Results of the experimental examples and the comparative example are shown in the graph of FIG. 8.

Referring to FIG. 8, as an aging time increases, a difference between the formation heights of the copper-tin IMC, $Cu_3Sn$, also increases. In particular, the difference between the experimental examples, in which the Zn particles are added, and the comparative example, in which the Zn particles are not added, is greater than the differences between the experimental examples, in which the Zn particles are added. Therefore, the formation of a copper-tin IMC may be meaningfully restrained by adding the Zn particles.

Moreover, in the experimental examples in which the Zn particles are added, as the content of the Zn particles is increased, the difference between the formation heights of the IMC of the experimental example and the comparative example increases. That is, when the content of the Zn particles increases, the generation of a copper-tin IMC may be better restrained.

FIGS. 9 through 12 are schematic diagrams illustrating a method of manufacturing a semiconductor package according to an embodiment of the present inventive concept.

Figure 9:
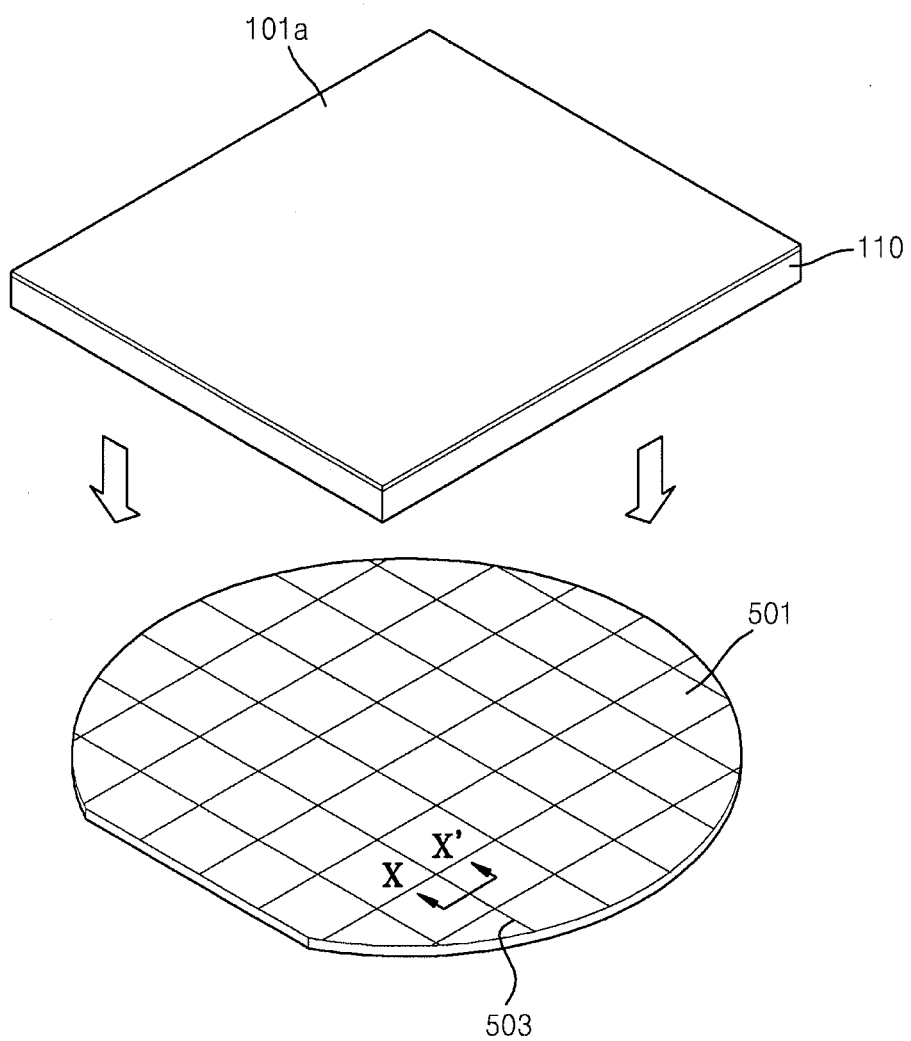
FIGS. 9 through 12 are schematic diagrams illustrating a method of manufacturing a semiconductor package, according to an embodiment of the present inventive concept.

Referring to FIG. 9, a wafer 501, on which a plurality of semiconductor devices are formed, is provided. The wafer 501 includes a plurality of semiconductor dies that are divided by scribe lanes 503.

Next, an NCF 110 is attached onto the wafer 501. As described above with reference to FIG. 1, release films may be attached to opposite surfaces of the NCF 110. FIG. 9 shows the NCF 110 on which only one release film 101a remains on one surface of NCF 100 after removing the release film from the other NCF 110 surface.

Figure 10:
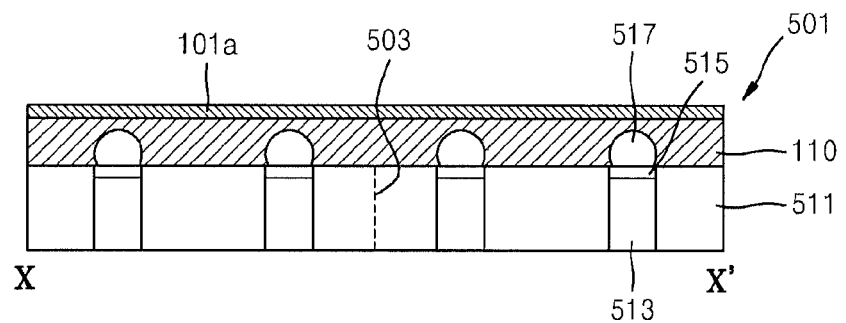

FIG. 10 is a side-sectional view of the wafer 501 taken along a line $X$-$X^1$ of FIG. 9. Referring to FIG. 10, penetration electrodes 513 are formed in a semiconductor substrate 511. Pillars 515 are disposed on upper portions of the penetration electrodes 513, and solder bumps 517 are provided on upper surfaces of the pillars 515, respectively.

Since the penetration electrodes 513 are as described above with reference to the corresponding components of FIG. 5, detailed descriptions thereof are not provided here. The pillars 515 may be formed integrally with or separately from the penetration electrodes 513.

In a case where the pillar 515 is formed of copper (Cu) and the solder bump 517 is mainly formed of Sn, when they are heated, Cu and Sn react with each other to form a copper-tin IMC such as $Cu_3Sn$ and $Cu_6Sn_5$. Also, if a nickel plating film or a nickel pad is disposed between the copper pillar 515 and the solder bump 517, an IMC such as $(Cu, Ni)_6Sn_5$ may be generated. A Kirkendall void may be generated due to these types of intermetallic compounds, and thus, the generation of such IMCs has to be restrained, for example as described below according to the present inventive concept.

Next in the fabrication process, the wafer 501 is diced with the scribe lanes 503 to be individualized.

As shown in FIG. 10, an NCF-type non-conductive layer is then formed on the solder bumps; however, a NCP-type non-conductive material may alternatively be used. When the NCP is used, one of ordinary art would appreciate that the NCP is applied to a desired location by using a mask, in which a pattern is formed, and heated and compressed to be hardened.

The solder bumps 517 may have native oxide layers thereon after being formed until the NCF 110 or the NCP is formed on the solder bumps 517. Such a native oxide layer may increase a resistance and may act to interfere with the dispersion of Zn particles, and thus, the native oxide layer needs to be removed.

As described above, if the NCF 110 or the NCP also includes a flux agent, the native oxide layer may be removed by the flux agent.

Figure 11:
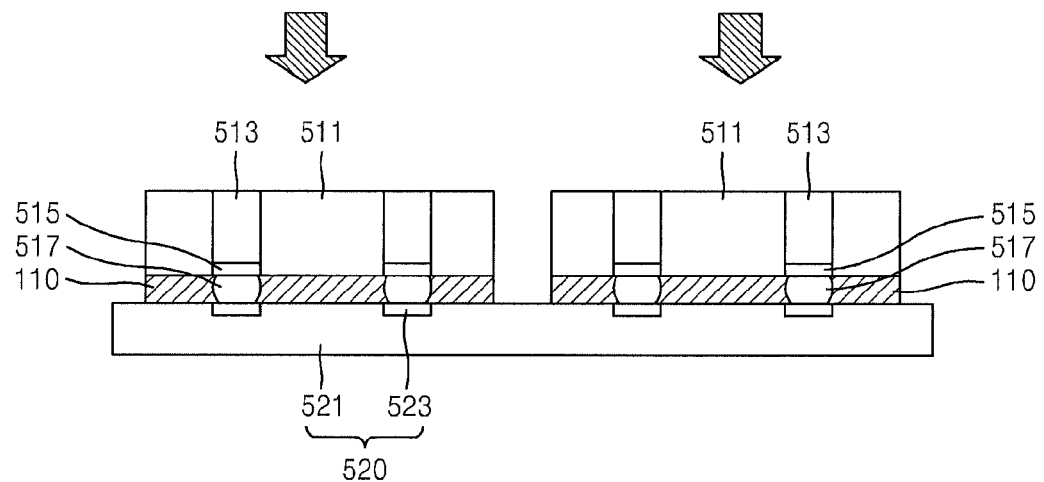

Referring to FIG. 11, after removing the release film 101*a* from each of the semiconductor dies that are individualized, the semiconductor dies may be attached to a substrate 520 such as another wafer. The substrate 520 may be a semiconductor substrate such as a wafer or a PCB. The substrate 520 may include a base portion 521 and connection pads 523 corresponding to and aligned with the solder bumps 517.

As shown in FIG. 11, the individualized semiconductor dies may be heated and compressed. Then, the solder bumps 517 may be bonded to the connection pads 523. Here, since heat and pressure are applied, at least a part of the solder bumps 517 may be melted to a liquid phase, and the Zn particles included in the NCF 110 thereby become dispersed into the melted portions of the solder bumps 517. Because the Zn particles from the NCF 110 become dispersed into the melted portions of the solder bumps 517, a concentration of the Zn particles in NCF 110 may be reduced when a distance to a surface of each of the solder bumps 517 is reduced.

Also, the Zn particles dispersed into the solder bumps 517 participate in the chemical reactions between metals to form an IMC with the Sn. As a result, formation of the IMC between Sn and Cu is restrained, and thus the generation of the Kirkendall void is prevented. In this way, the reliability of the electric connections via the solder bumps 517 may be improved, and an electric connection property may be excellent.

FIG. 11 shows one semiconductor chip obtained by dicing the semiconductor substrate 511 attached onto the substrate 520; however, it will be understood that a plurality of semiconductor chips may be stacked on the substrate 520.

Figure 12:
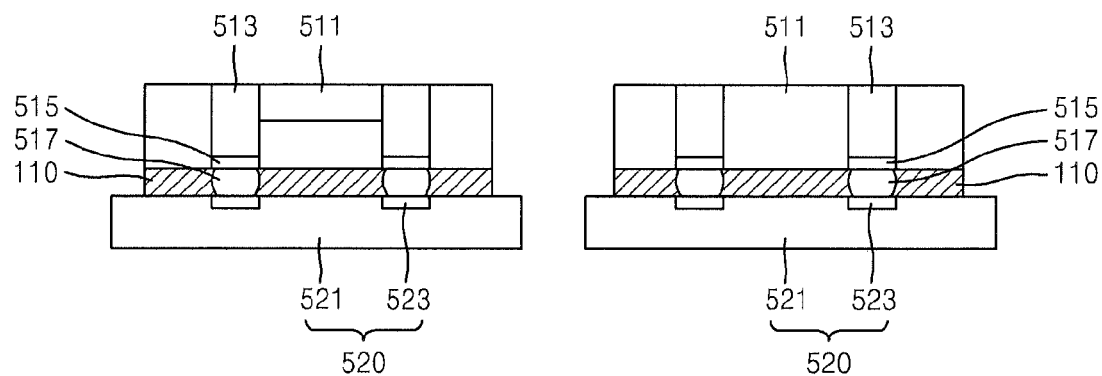

Referring to FIG. 12, the substrate 520 is diced into individual semiconductor packages. If necessary, the semiconductor packages may further undergo an encapsulation process in order to protect the semiconductor packages against external heat, shock, and moisture.

When the NCF or the NCP according to embodiments of the present inventive concept is used, semiconductor packages having excellent electric connection properties and high reliabilities may be manufactured through simple manufacturing processes and at low manufacturing costs.

Figure 13:
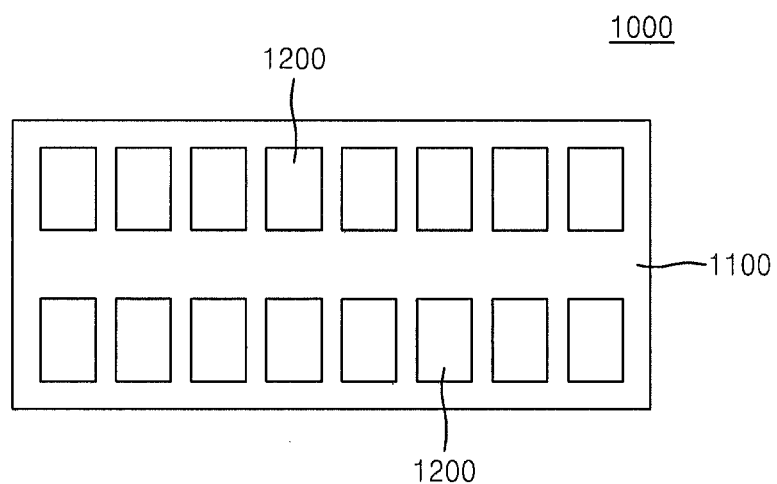
FIG. 13 is a schematic plan view of a memory module including semiconductor packages, according to an embodiment of the present inventive concept.

FIG. 13 is a plan view of a memory module 1000 including semiconductor packages 1200, according to an embodiment of the present inventive concept.

In particular, the memory module 1000 may include a PCB 1100 and the semiconductor packages 1200.

The semiconductor packages 1200 may include semiconductor packages according to the embodiments of the present inventive concept. In particular, the semiconductor packages 1200 may include at least one semiconductor package selected from the semiconductor packages according to the above-described embodiments of the present inventive concept.

The memory module 1000 according to the present embodiment may be a single in-lined memory module (SIMM), in which the semiconductor packages 1200 are mounted on a surface of a PCB, or a dual in-lined memory module (DIMM), in which the semiconductor packages 1200 are mounted on opposite surfaces of a PCB. Additionally, the memory module 1000 may be a fully buffered DIMM (FB-DIMM) including an advanced memory buffer (AMB) that provides external signals to the plurality of semiconductor packages 1200.

Figure 14:
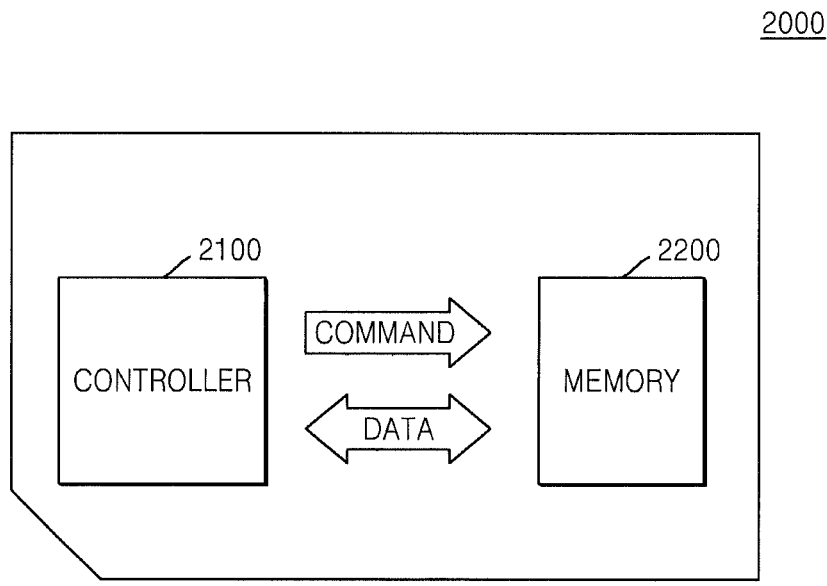
FIG. 14 is a schematic diagram of a memory card including semiconductor packages, according to an embodiment of the present inventive concept.

FIG. 14 is a schematic diagram of a memory card 2000 including semiconductor packages according to an embodiment of the present inventive concept.

In the memory card 2000, a controller 2100 and a memory 2200 may be disposed to exchange electric signals. For example, when the controller 2100 commands, the memory 2200 may transfer data.

The memory 2200 may include semiconductor packages according to embodiments of the present inventive concept. In particular, the memory 2200 may include at least one semiconductor package selected from the semiconductor packages according to the above-described embodiments of the present inventive concept.

The memory card 2000 may configure various kinds of memory cards, for example, a memory stick card, a smart media card (SM), a secure digital card (SD), a mini-secure digital card (mini SD), and a multimedia card (MMC).

Figure 15:
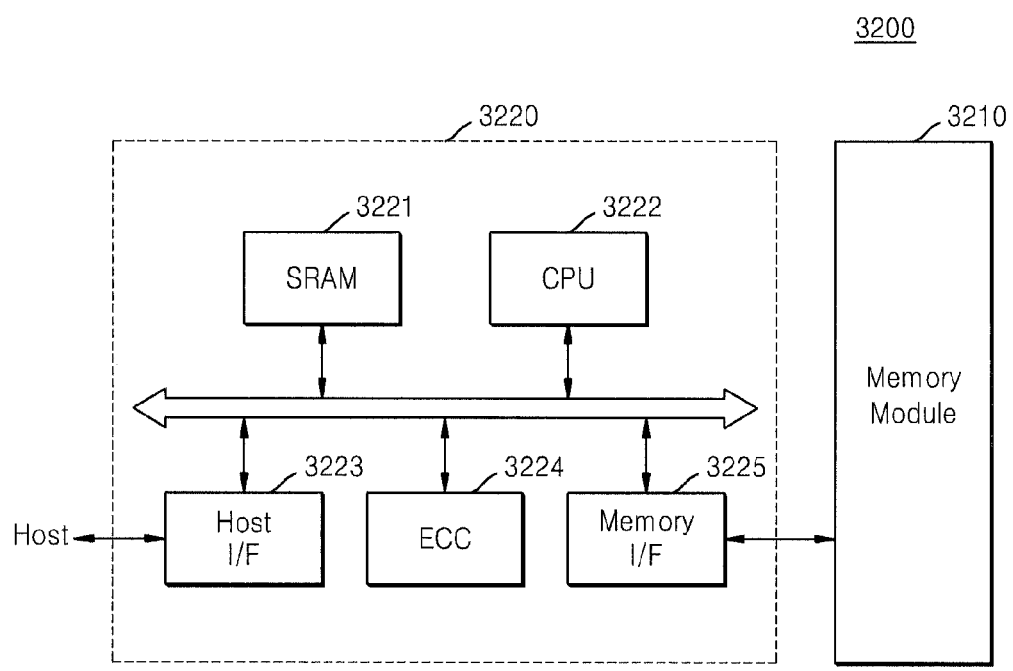
FIG. 15 is a block diagram of a memory device including semiconductor packages, according to an embodiment of the present inventive concept.

FIG. 15 is a block diagram of a memory device 3200 including semiconductor packages according to an embodiment of the present inventive concept.

Referring to FIG. 15, the memory device 3200 includes a memory module 3210. The memory module 3210 may include at least one of the semiconductor packages described above according to embodiments of the present inventive concept. Also, the memory module 3210 may further include a semiconductor memory device (for example, a non-volatile memory device and/or SRAM) of a different type. The memory device 3200 may include a memory controller 3220 controlling data exchange between a host and the memory module 3210.

The memory controller 3220 may include a processing unit 3222 that controls overall operations of the memory device 3200. Also, the memory controller 3220 may include SRAM 3221 that is used as an operating memory of the processing unit 3222. Moreover, the memory controller 3220 may further include a host interface 3223 and a memory interface 3225. The host interface 3223 may include a data exchange protocol between the memory device 3200 and the host. The memory interface 3225 may connect the memory controller 3220 and the memory module 3210 to each other. Further, the memory controller 3220 may further include an error correction code (ECC) block 3224. The ECC block 3224 may detect and correct errors of the data read from the memory module 3210. Although not shown in FIG. 15, the memory device 3200 may further include ROM storing code data for interfacing with the host. The memory device 3200 may be configured as a solid state drive (SSD) that may substitute for a hard disk of a computer system.

Figure 16:
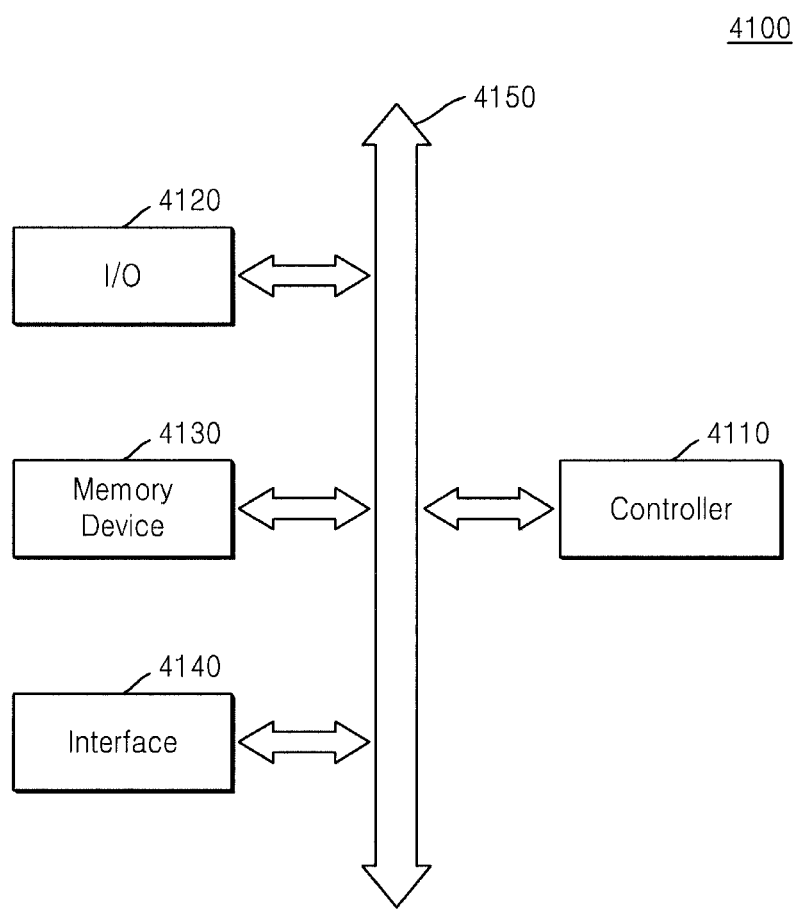
FIG. 16 is a block diagram of an electronic system including semiconductor packages, according to an embodiment of the present inventive concept.

FIG. 16 is a block diagram of an electronic system 4100 including semiconductor packages according to an embodiment of the present inventive concept.

Referring to FIG. 16, the electronic system 4100 according to the present embodiment may include a controller 4110, an input/output (I/O) device 4120, a memory device 4130, an interface 4140, and a bus 4150. The controller 4110, the I/O device 4120, the memory device 4130, and/or the interface 4140 may be connected to each other via the bus 4150. The bus 4150 corresponds to a path through which data is transferred.

The controller 4110 may include at least one of a microprocessor, a digital signal processor, a microcontroller, and logic devices performing similar functions. The I/O device 4120 may include a keypad, a keyboard, and a display device. The memory device 4130 may store data and/or commands. The memory device 4130 may include at least one of the semiconductor packages described above according to embodiments of the present inventive concept. Also, the memory device 4130 may further include a semiconductor memory device of a different type (for example, a non-volatile memory device and/or SRAM). The interface 4140 may transfer data to a communication network or receive data from the communication network. The interface 4140 may be a wired or a wireless interface. For example, the interface 4140 may include an antenna or a wired/wireless transceiver. Although not shown in FIG. 16, the electronic system 4100 may further include high speed DRAM and/or SRAM as an operating memory device for improving operations of the controller 4110.

The electronic system 4100 may be applied to a personal digital assistant (PDA), a portable computer, a web tablet, a wireless phone, a mobile phone, a digital music player, a memory card, or all kinds of electronic products that may transmit and/or receive information in a wireless environment.

Figure 17:
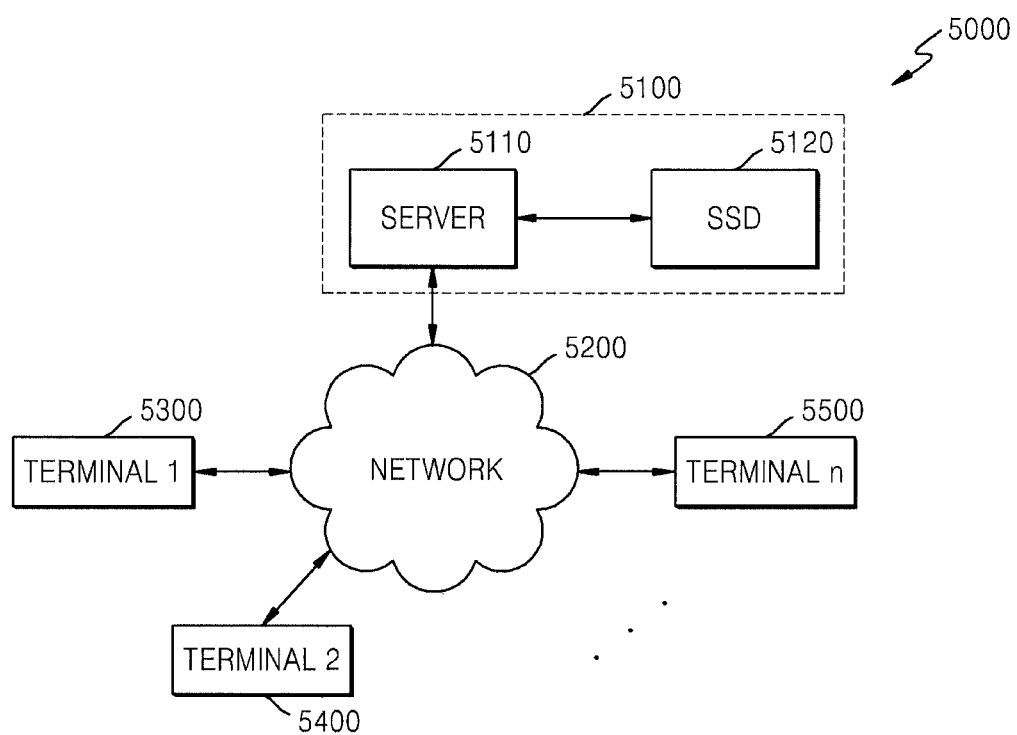
FIG. 17 is a block diagram of a network system including a service system that includes an electronic apparatus, according to an embodiment of the present invention.

FIG. 17 is a block diagram of a network system 5000 including a server system 5100 including an electronic device 5120 according to an embodiment of the present inventive concept.

Referring to FIG. 17, the network system 5000 according to the present embodiment may include the server system 5100 and a plurality of terminals 5300, 5400, and 5500 that are connected to each other via a network 5200. The server system 5100 according to the present embodiment may include a server 5110 processing requests transmitted from the plurality of terminals 5300, 5400, and 5500 connected to the network 5200, and the electronic device 5120 storing data corresponding to the requests transmitted from the terminals 5300, 5400, and 5500. Here, the electronic device 5120 may be a semiconductor package according to the embodiments of the present inventive concept as shown in FIGS. 4 through 6. The electronic device 5120 may be, for example, an SSD.

The electronic devices described above may be mounted in various types of packages, for example, package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat-pack (TQFP), small outline integrated circuit (SOIC), shrink small outline package (SSOP), thin small outline package (TSOP), thin quad flat-pack (TQFP), system in package (SIP), multi chip package (MCP), water-level fabricated package (WFP), and water-level processed stack package (WSP).

While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
a first substrate including first electrode terminals;
a second substrate including second electrode terminals facing the first electrode terminals; and
a non-conductive material layer containing a dispersion of pure zinc (Zn) particles having an average particle diameter of about 1 nm to about 200 nm unevenly distributed in the non-conductive material layer such that a concentration of the zinc (Zn) particles in the non-conductive material layer at a location that is separated by a first distance from each of the first electrode terminals is less than a concentration of the zinc (Zn) particles at a location that is separated by a second distance, that is greater than the first distance, from each of the first electrode terminals, and also where the non-conductive material layer is disposed between the first substrate and the second substrate.

2. The semiconductor package of claim 1, wherein the concentration of the Zn particles in the non-conductive material layer becomes lower as a distance to a first electrode terminal decreases.

3. The semiconductor package of claim 1, wherein the first electrode terminals and the second electrode terminals are electrically connected to each other via solder bumps.

4. The semiconductor package of claim 3, wherein each of the solder bumps comprises an intermetallic compound (IMC), and at least a part of the IMC comprises zinc.

5. The semiconductor package of claim 4, wherein at least a part of the IMC comprises an IMC between tin (Sn) and Zn.

6. The semiconductor package of claim 1, wherein the first substrate and the second substrate are two semiconductor chips that are identical to each other.

7. The semiconductor package of claim 1, wherein the first substrate is a printed circuit board (PCB) or an interposer, and the second substrate is a semiconductor chip.

8. An electronic system comprising:
a controller;
an input/output unit for inputting or outputting data;
a memory unit for storing the data;
an interface unit for transmitting or receiving data to or from an external device; and
a bus for connecting the controller, the input/output unit, the memory unit, and the interface unit so as to communicate with each other,
wherein at least one of the controller and the memory unit comprises the semiconductor package of claim 1.

9. A semiconductor package comprising at least first and second semiconductor devices disposed on a substrate, where the first and second semiconductor devices are separated from each other and have corresponding facing electrical connection pads connected by first device-to-second device tin-based solder bumps, the improvement comprising a non-conductive material layer between the first and second semiconductor devices that surrounds and contacts the first device-to-second device solder bumps, said non-conductive material layer comprising a non-conductive polymer based material containing an unevenly distributed dispersion of pure zinc particles such that a concentration of the zinc (Zn) particles in the non-conductive material layer at a location that is separated by a first distance from each of the first electrode terminals is less than a concentration of the zinc (Zn) particles at a location that is separated by a second distance, that is greater than the first distance, from each of the first electrode terminals.

10. A semiconductor package according to claim 9 wherein the zinc particles have an average particle diameter of about 1 nm to about 200 nm and also wherein the zinc content in the non-conductive polymer base material ranges from about 0.1% to about 20% by weight.

11. A semiconductor package according to claim 9 wherein the substrate and the first semiconductor device are separated from each other and have corresponding facing electrical connection pads connected by substrate-to-device tin-based solder bumps, further wherein there is a non-conductive material layer between the substrate and the first semiconductor device that surrounds and contacts the substrate-to-device solder bumps, said non-conductive material layer comprising a non-conductive polymer base material containing a dispersion of zinc particles.

12. A semiconductor package according to claim 11 wherein at least three semiconductor devices are stacked on a substrate and wherein tin-based solder bumps provide electrical connections between adjacent but separated semiconductor devices, further wherein there is non-conductive material layer between adjacent semiconductor devices that surrounds and contacts the solder bumps, said non-conductive material layer comprising a non-conductive polymer base material containing a dispersion of zinc particles.

* * * * *